(12) United States Patent
Ahn et al.

(10) Patent No.: US 7,378,326 B2
(45) Date of Patent: May 27, 2008

(54) PRINTED CIRCUIT BOARD WITH EMBEDDED CAPACITORS THEREIN AND MANUFACTURING PROCESS THEREOF

(75) Inventors: Jin Yong Ahn, Daejeon (KR); Cheol Seong Hwang, Seoul (KR); Sung Kun Kim, Seoul (KR); Chang Sup Ryu, Daejeon (KR); Suk Hyeon Cho, Daejeon (KR); Ho Sik Jeon, Chungcheongbuk-do (KR)

(73) Assignee: Samsung Electro-Mechanics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/365,219

(22) Filed: Feb. 28, 2006

(65) Prior Publication Data

US 2006/0196691 A1    Sep. 7, 2006

(30) Foreign Application Priority Data

Mar. 2, 2005    (KR) .................. 10-2005-0017333

(51) Int. Cl.
*H01L 21/20*    (2006.01)
*H05K 3/30*    (2006.01)

(52) U.S. Cl. ............... 438/361; 438/393; 257/E21.008; 257/E21.35; 29/832

(58) Field of Classification Search ............... 257/532, 257/535, E21.008, E21.35; 438/381, 393, 438/957; 29/832

See application file for complete search history.

(56) References Cited

U.S. PATENT DOCUMENTS

| | | | |
|---|---|---|---|
| 5,079,069 A | 1/1992 | Howard et al. | |
| 5,261,153 A | 11/1993 | Lucas | |
| 5,501,350 A * | 3/1996 | Yoshida et al. | ............... 216/20 |
| 5,800,575 A | 9/1998 | Lucas | |
| 6,274,224 B1 | 8/2001 | O'Bryan et al. | |
| 6,349,456 B1 | 2/2002 | Dunn et al. | |
| 7,297,591 B2 * | 11/2007 | Won et al. | .................. 438/253 |
| 2002/0106451 A1 * | 8/2002 | Skarp et al. | ............. 427/248.1 |
| 2004/0118600 A1 * | 6/2004 | Lee et al. | .................... 174/260 |
| 2005/0100719 A1 * | 5/2005 | Kanakarajan et al. | ....... 428/209 |
| 2005/0208754 A1 * | 9/2005 | Kostamo et al. | ............ 438/622 |
| 2006/0143886 A1 * | 7/2006 | Srinivasan et al. | ........ 29/25.41 |
| 2006/0203421 A1 * | 9/2006 | Morris et al. | ................ 361/277 |

FOREIGN PATENT DOCUMENTS

| | | |
|---|---|---|
| JP | 2002-367858 | 12/2002 |
| KR | 2004-0060443 | 7/2004 |

* cited by examiner

*Primary Examiner*—Long K Tran
(74) *Attorney, Agent, or Firm*—Darby & Darby P.C.

(57) ABSTRACT

A printed circuit board having embedded capacitors includes a double-sided copper-clad laminate including first circuit layers formed in the outer layers thereof, the first circuit layers including bottom electrodes and circuit patterns; dielectric layers formed by depositing alumina films on the first circuit layers by atomic layer deposition; second circuit layers formed on the dielectric layers and including top electrodes and circuit patterns; one-sided copper-clad laminates formed on the second circuit layers; blind via-holes and through-holes formed in predetermined portions of the one-sided copper-clad laminates; and plating layers formed in the blind via-holes and the through-holes. The manufacturing method of the printed circuit board is also disclosed.

18 Claims, 7 Drawing Sheets

PRINTED CIRCUIT BOARD WITH EMBEDDED CAPACITORS THEREIN AND MANUFACTURING PROCESS THEREOF

INCORPORATION BY REFERENCE

The present application claims priority under 35 U.S.C. §119 to Korean Patent Application No. 10-2005-0017333 filed on Mar. 2, 2005. The content of the application is incorporated herein by reference in its entirety.

BACKGROUND OF THE INVENTION

1. Field of the Invention

The present invention relates to a printed circuit board having embedded capacitors therein and a manufacturing process thereof. More particularly, the present invention relates to a process for manufacturing a printed circuit board having embedded capacitors therein, in which dielectric layers are formed using a ceramic material having high dielectric capacitance by atomic layer deposition (ALD), so as to form a capacitor having a high dielectric constant corresponding to the capacitance of decoupling chip capacitors, as well as a printed circuit board manufactured by the method.

2. Description of the Prior Art

Common discrete chip resistors or discrete chip capacitors have been mounted on the surfaces of most printed circuit boards (PCBs). Recently, printed circuit boards having embedded passive devices, such as resistors, capacitors, etc., have been developed.

Such printed circuit boards having embedded passive devices therein are manufactured by a process comprising inserting passive devices such as resistors, capacitors, etc., into an inner or outer layer of a substrate using novel materials (substances) and processes, thereby replacing the functions of conventional chip resistors and chip capacitors. That is, the printed circuit boards having embedded passive devices therein include passive devices, e.g., capacitors, buried in the inner or outer layer of the substrate. The term "embedded capacitors" as used herein refers to capacitors as passive devices which are mounted as parts of a printed circuit board, regardless of the size of a substrate. The substrate is referred to as an "embedded capacitor PCB". The most important advantage of the embedded capacitor PCB is that since the capacitors are integrated as parts of the printed circuit board, there is no need to mount the capacitors on the surfaces of the printed circuit board.

Meanwhile, recent techniques for manufacturing the capacitor-embedded printed circuit board are largely classified into the following three techniques:

The first technique is a method for manufacturing polymer thick film type capacitors comprising applying a polymer capacitor paste and thermal curing (that is, drying) the paste. Specifically, according to this method, the embedded capacitors are formed by applying the polymer capacitor paste on the printed circuit board inner layer, drying the polymer capacitor paste, printing a copper paste on the resulting printed circuit board to form electrodes and drying the copper paste.

The second technique is a method for manufacturing embedded discrete type capacitors comprising coating a ceramic filled photo-dielectric resin on a printed circuit board. The related patent is held by Motorola Inc. (see U.S. Pat. No. 6,349,456). Specifically, according to this method, the discrete capacitors are formed by applying the photo-dielectric resin containing ceramic powder on both surfaces of a substrate, laminating copper foils thereto to form respective top electrodes and bottom electrodes, forming circuit patterns thereon, and etching the photo-dielectric resin.

The third technique is a method for manufacturing capacitors comprising inserting dielectric layers having a capacitance characteristic into the printed circuit board inner layer, thereby replacing decoupling capacitors which have been mounted on the surfaces of the conventional printed circuit boards. The related patent is owned by Sanmina Corp. (see U.S. Pat. Nos. 5,079,069, 5,261,153, and 5,800,575). Specifically, according to this method, power-distributed decoupling capacitors are formed by a process comprising inserting dielectric layers composed of power electrodes and ground electrodes into the inner layers of the printed circuit board.

A variety of processes have been developed based on the three techniques discussed above. Procedures for carrying out the processes are different from each other. Since the market for printed circuit boards having embedded capacitors therein is small, these techniques have not yet been standardized and trials to develop commercially available processes are still ongoing.

The above-described embedded capacitors are advantageous in that, because the capacitors are inserted into a board, they can reduce the area occupied by chip capacitors, leading to an increase in the mounting density of chips. Another advantage is that the embedded capacitors eliminate the need to mount chip capacitors on the surface. In the prior art, the connection distance between devices is so long that electrical parasitism occurs at a high level, thereby reducing the electric performance of products. Also, an increase in the number of electrical connections by soldering, etc., causes a problem with the reliability of products. However, the use of embedded capacitors can shorten the connection length between devices to reduce electrical parasitism, thus improving the electrical performance of products.

The material of the embedded capacitors in the embedded capacitor PCBs according to the prior art is a polymer material or ceramic-filled photosensitive resin which is suitable for use in printed circuit board processes. However, there is a problem in that the material is too low in dielectric capacitance to perform the role of chip capacitors.

To obtain high-capacity capacitors, a dielectric material having a high dielectric constant needs to be used. The smaller the thickness of the dielectric material and the larger the surface area, the higher the capacitance of capacitors.

For example, U.S. Pat. No. 6,274,224 issued to 3M Corporation discloses an embedded capacitor fabricated by forming a thick film-type dielectric layer having a thickness of 0.5-10 µm between copper foils acting as power and ground electrodes, the capacitor being formed of a composite of $BaTiO_3$ ceramic powder and thermosetting resin, such as epoxy or polyimide. The embedded capacitor according to said patent has the following properties: surface roughness of the copper foils: 10-300 nm; capacitance per unit area of the dielectric layer: 10 $nF/in^2$ or more; and adhesion: 3 lb/inch or more. As described above, the capacitance per unit area of the embedded capacitors according to the prior art is about 5-1 $nF/in^2$ or 10 $nF/in^2$, which is significantly lower than 100 $nF/in^2$ for generally used decoupling discrete chip capacitors. This indicates that there are many limitations in forming embedded capacitors having high capacitance.

High dielectric materials and process conditions used in forming embedded capacitors according to the prior art are summarized in Table 1 below.

TABLE 1

| Dielectric materials | Thickness of dielectric thin film (μm) | Formation temperature of dielectric thin film (° C.) | Dielectric capacitance (nF/in$^2$) | Methods of forming embedded capacitors |
|---|---|---|---|---|
| Ta$_2$O$_5$ | 0.3 | 500 | 425 | Forming a Ta$_2$O$_5$ film 0.3 μm thick on a Si substrate (50 μm thick) by an anodic oxidation process, forming a top electrode (Cr/Cu) thereon and fabricating multi-layer PCB through a build-up process. |
| BaTiO$_3$ | 10 | 350 | 650 | Forming a BaTiO$_3$ ceramic thin film 0.5 μm thick on a copper foil by a sol-gel process, and forming a top electrode (Ni/Cu) by thermal treatment at 350° C. |
| SrTiO$_3$ | 0.6 | >500 | 300 | Forming a bottom electrode (0.2 μm thick) in the FR4 substrate, depositing an SrTiO$_3$ film 0.3 μm thick thereon by sputtering, and forming a top electrode (Ni/Cu) on the film. |
| (Ba, Sr)TiO$_3$ | 0.1 | 260 | 2400 | Forming dielectric films of 100 nm on a Si substrate by sputtering at 260° C., and forming Pt films as top and top electrodes. thereon |
| Ceramic film (Dk = 400) | 3 | R.T. | 2580 | Forming a dielectric thin film on the FR4 substrate by an aerosol deposition process. |
| BaTiO$_3$ | 25 | 900 | 15-700 | Forming a ceramic paste on a copper foil by screen printing, sintering the paste at 900° C. in a nitrogen atmosphere, and forming a top electrode using a conductive paste. |
| (Pb, Zr)TiO$_3$ | 0.2 | 650 | 1290-1935 | Forming a (Pb,Zr)TiO$_3$ film on a copper foil by a sol-gel process, crystallizing the film at 650° C. in a nitrogen atmosphere, and forming top and bottom electrodes using Cu/Ni. |

As shown in Table 1, a dielectric ceramic material having a high dielectric constant is difficult to actually apply onto a printed circuit board because it necessarily involves a crystallization process at a high temperature, at which deformation of the resin board occurs. Also, if the dielectric material can be formed into a film at low temperature, the material will be difficult to apply onto a printed circuit board having a large area.

Accordingly, there is an urgent need for technology to manufacture a printed circuit board including embedded capacitors which not only have a higher dielectric capacitance than sheet-type capacitors embedded in the prior printed circuit boards, but also can be formed to have a large area at relatively low process temperatures.

SUMMARY OF THE INVENTION

Accordingly, the present invention has been made keeping in mind the above problems occurring in the prior art, and an object of the present invention is to provide a process for manufacturing a printed circuit board having embedded capacitors therein, in which the embedded capacitors are formed using a dielectric ceramic material other than a composite material of ceramic material and polymer or resin, by a chemical reaction controlling an atomic monolayer, thus enabling high dielectric capacitance values, as well as a printed circuit board manufactured by the method.

Another object of the present invention is to provide a process for processing a printed circuit board having embedded capacitors therein, which allows a dielectric material to be formed into a film at a low temperatures at which deformation of a resin board does not occur, as well as a printed circuit board manufactured by the method.

In order to accomplish the above object, in one aspect, the present invention provides a process for manufacturing a printed circuit board having embedded capacitors therein, the process includes forming first circuit layers, including bottom electrodes and circuit patterns, in the outer layers of a double-sided copper-clad laminate; depositing alumina (Al$_2$O$_3$) films on the first circuit layers by atomic layer deposition (ALD) to form dielectric layers thereon; forming second circuit layers, including top electrodes and circuit patterns, on the dielectric layers; depositing one-sided copper-clad laminates on the second circuit layers; forming blind via-holes and through-holes in predetermined portions of the one-sided copper-clad laminate; and plating the blind via-holes and the through-holes to form interlayer connections.

In another aspect, the present invention provides a printed circuit board having embedded capacitors includes a double-sided copper-clad laminate having first circuit layers formed in the outer layers thereof, the first circuit layers including bottom electrodes and circuit patterns; dielectric layers formed by depositing alumina films on the first circuit layers of the copper-clad laminate using atomic layer deposition; second circuit layers formed on the dielectric layers, the second circuit layers including top electrodes and circuit patterns; one-sided copper-clad layers deposited on the second circuit layers; blind via-holes and through-holes formed in predetermined portions of the one-sided copper-clad layers; and plating layers formed in the blind via-holes and the through-holes.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

The present invention will be described in further detail by way of example with reference to the accompanying drawings.

As described above, the present invention relates to a dielectric layer material used in forming embedded capacitors, and a process for manufacturing a printed circuit board having embedded capacitors therein, the process improving on a process of forming the dielectric material into a film, as well as a printed circuit board manufactured by the method.

In the prior art, as the dielectric layer material of embedded capacitors, a composite material of epoxy and high dielectric filler is used to form dielectric layers. In the present invention, however, a dielectric ceramic material is used alone to form dielectric layers by atomic layer deposition.

Generally, the dielectric ceramic material necessarily requires a notably high temperature of more than 500° C. for crystallization thereof. For this reason, on a printed circuit board made of resin, it is impossible to form films using this dielectric material, unlike the case of semiconductor substrates.

Figure 1:
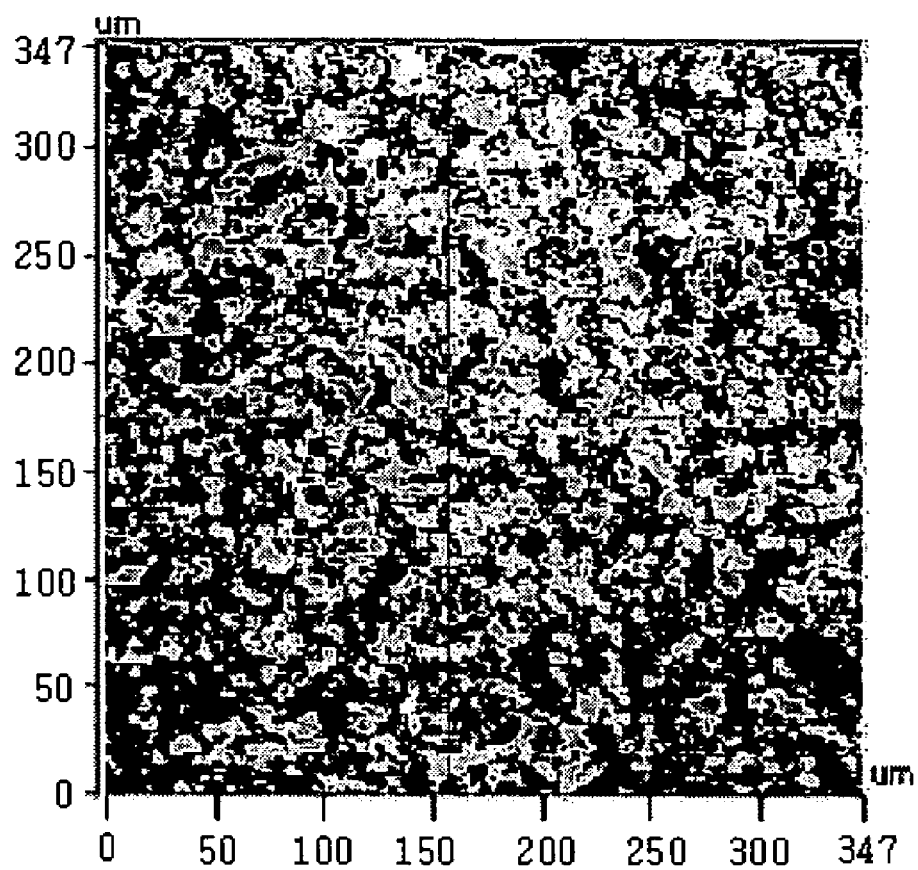
FIG. 1 is a photograph showing a measurement result for the surface roughness of the copper foil of a printed circuit board.

In the case of conventional printed circuit boards, as shown in FIG. 1, a copper-clad laminate (CCL) having a surface roughness (Ra) of more than 0.4 µm is used to prevent delamination. To overcome the surface step height features of these printed circuit boards, the thickness of a film formed on the surface needs to be large, resulting in the problem of a decrease in dielectric capacitance values.

Particularly for application as signal matching capacitors, the COG values (temperature characteristics) need to have a capacitance change of 0±30 ppm/° C. over a temperature range of −55° C. to +125° C.

However, current thicker film-type embedded capacitors do not meet COG requirements because they have a high tolerance of ±15% in temperature characteristics due to the properties of epoxy and ceramic filler used as dielectric materials.

Meanwhile, the atomic layer deposition which is widely used in semiconductor processing has advantages in that step coverage is excellent and process temperature is relatively low, since it is carried out below thermal decomposition temperature using the strong surface reaction of source materials. Also, the atomic layer deposition has a small thickness variation, of less than ±1%, leading to high capacitance tolerance, because it is a process of controlling an atomic monolayer.

With this background, the applicant has found that, when alumina ($Al_2O_3$) selected from dielectric ceramic materials having high dielectric constants was used to form dielectric films by atomic layer deposition, the high dielectric constant properties of alumina could be ensured by the extreme surface reaction of source materials even at low process temperature, (25-250° C.) instead of high process temperature required for the prior conventional dielectric ceramic material, so that dielectric layers for embedded capacitors, which not only have high capacitance properties in a temperature range in which substantial deformation of a board does not occur, but also excellent step coverage properties, could be formed to have large area.

According to the present invention, it is possible to form a dielectric layer having capacitance values of several hundreds to several thousands of $nF/inch^2$ by forming a high-dielectric alumina film on a copper-clad laminate having bottom electrodes formed therein, by atomic layer deposition to a thickness of several tens to several thousands of Å, and then, form top electrodes on the dielectric layer, followed by performing a build-up process for manufacturing a multilayer printed circuit board.

Figure 2:
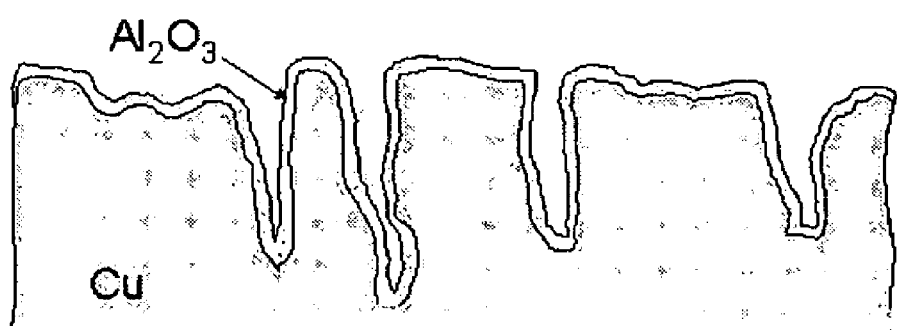
FIG. 2 is a schematic diagram of an alumina thin film formed on the surface of a copper foil by atomic layer deposition according to the present invention.
Figure 3:
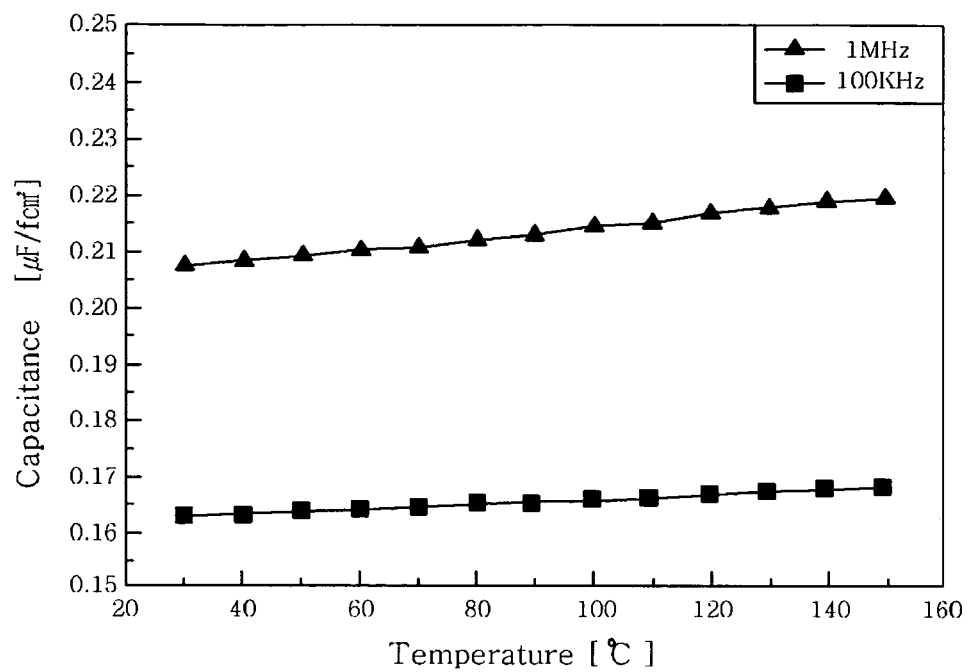
FIG. 3 is a graphic diagram showing temperature as a function of frequency for an alumina thin film of the present invention.

FIG. 2 shows a schematic diagram of an alumina deposition film formed to have excellent step coverage, depending on the surface roughness of the copper foil layer of a printed circuit board, by atomic layer deposition according to the inventive method. As described above, by depositing the alumina film having excellent step coverage by atomic layer deposition, the surface roughness (about 0.3-0.5 µm) of the copper foil layer before deposition of the alumina film can be maintained unchanged even after deposition of the alumina film, enabling a large surface area to be ensured. Thus, even when a dielectric layer having the same thickness is formed, relatively high capacitance can be obtained.

According to the present invention, the copper-clad laminate having a surface roughness (Ra) of about 0.3-0.5 µm can be imparted with an additional surface roughness of about 1-5 µm by, for example, chemical etching, to make the surface area larger, thus increasing the capacitance value.

As reported in the literature, COG test results for an $Al_2O_3$ thin film deposited on a Si substrate by atomic layer deposition show 41 ppm/° C. at 1 MHz, and 100 ppm/° C. at 100 KHz. This report indicates that the higher the usage frequency, the lower the COG value is, suggesting that signal-matching capacitors are sufficiently applicable in a high frequency range.

These characteristics of the alumina thin film formed by atomic layer deposition allow the embedded capacitors formed according to the inventive method to be applied not only as decoupling capacitors but also as signal matching capacitors.

In addition, one of the great improvements of the present invention is that it is possible to deposit a dielectric film in a large area (405×510). In other words, by applying the atomic layer deposition, which can control an atomic monolayer and utilizes the chemical reaction of gas, it is possible to deposit a dielectric film having the panel size used in printed circuit board processes.

In the present invention, trimethylaluminum (TMA; Al(CH$_3$)$_3$) gas is used as the raw material of alumina so that both sides of a copper-clad laminate can be simultaneously deposited with alumina films by the chemical reaction of TMA. Thus, the present invention has an advantage in that it is possible to execute the build-up of a printed circuit board so as to exhibit high productivity.

More specifically, the alumina films are formed by atomic layer deposition using trimethylaluminum as source gas at a board temperature maintained at 25-250° C., preferably 100-200° C. and more preferably 120-150° C. If the board temperature is less than 5° C., the dielectric characteristics of the alumina films cannot be sufficiently ensured such that the desired high dielectric capacitance value cannot be achieved. On the other hand, a board temperature of more than 250° C. can cause the deformation of a resin board and is disadvantageous in terms of efficiency versus economy to achieve high dielectric capacitance values.

Also, the alumina films are formed by repeatedly performing the atomic layer deposition using (i) a source gas of trimethylaluminum and (ii) a source gas of H$_2$O, H$_2$O plasma, O$_2$ plasma or O$_3$ oxidant, which are sequentially introduced, so as to deposit alumina films having the desired thickness. In this regard, after the introduction of each of the source gases, conventional inert gas for purging, such as Ar, is introduced.

The thickness of each of the alumina films formed as described above is 50-5000 Å, and preferably 100-750 Å, in terms of efficiency versus economy, to achieve high dielectric capacitance values.

Meanwhile, the alumina films deposited all over the board as described above may, if necessary, be selectively etched with conventional etchant or by dry etching, such that portions of the alumina films to be applied as capacitors will remain on the bottom electrodes. This can lead to an increase in junction reliability.

In this regard, the etching can be carried out by a wet or dry etching process. The wet etching process is carried out as in conventional printed circuit board processes by applying photoresist dry films on the alumina films in given patterns and opening only the portions desired to be etched, by exposure and development processes, followed by etching the alumina films with alumina etchant. The drying etching process is carried out by etching the alumina films with ion beam or plasma. Particularly, the dry etching process is advantageous in that it can be carried out at vacuum pressure using mainly RIE equipment.

Figure 4:
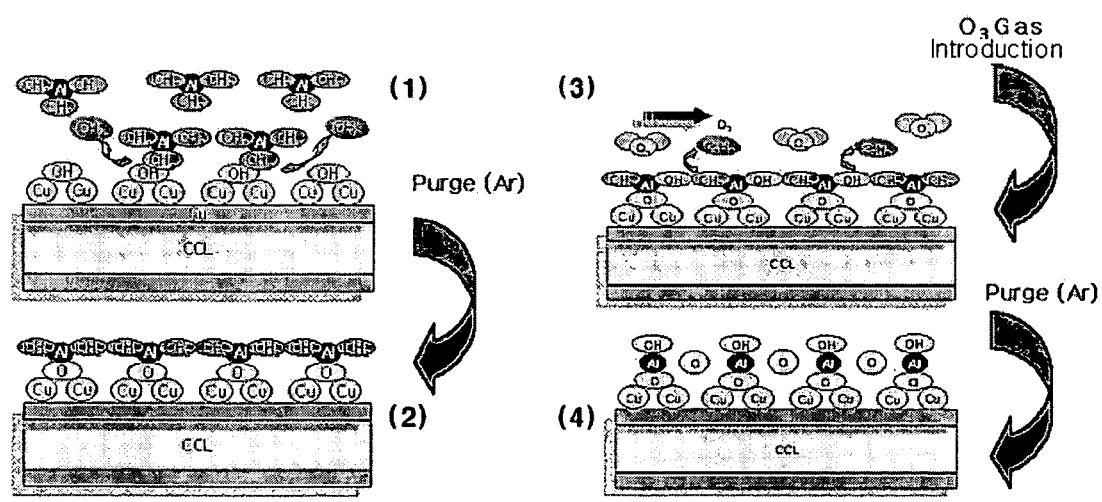
FIG. 4 is a schematic diagram showing the principle of depositing an alumina film onto a copper-clad laminate by atomic layer deposition according to the present invention.

FIG. 4 schematically shows the principle of depositing the alumina films on the copper-clad laminate by the atomic layer deposition according to the present invention. The principle will now be schematically described with reference to FIG. 4.

(1) The introduced Al(CH$_3$)$_3$ gas is chemically adsorbed onto a printed circuit board according to the following chemical reaction (1):

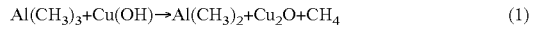

$$Al(CH_3)_3 + Cu(OH) \rightarrow Al(CH_3)_2 + Cu_2O + CH_4 \quad (1)$$

(2) By purging with gas, for example, Ar gas, one layer of the Al precursor remains on the board.

(3) By the introduction of an oxidant, for example, O$_3$ gas, Al$_2$O$_3$ produced by the chemical reaction of the precursor with the O$_3$ gas is chemically adsorbed onto the board according to the following chemical reaction (2):

$$2Al(CH_3)_2 + O_3 \rightarrow Al_2O_3 + 2C_2H_6 \quad (2)$$

(4) Unwanted 2C$_2$H$_6$ is removed by purging with Ar gas so that one layer of Al$_2$O$_3$ remains on the board.

(5) Cycles: the steps (1)-(4) are repeated to reach the desired thickness.

For reference, according to the inventive method, an Al$_2$O$_3$ thin film was actually formed on a copper-clad layer by atomic layer deposition, and Pt as the material of the top electrodes was deposited on the alumina film. The alumina film was measured for electrical properties, and the results are shown in FIGS. 5 to 7.

Figure 5:
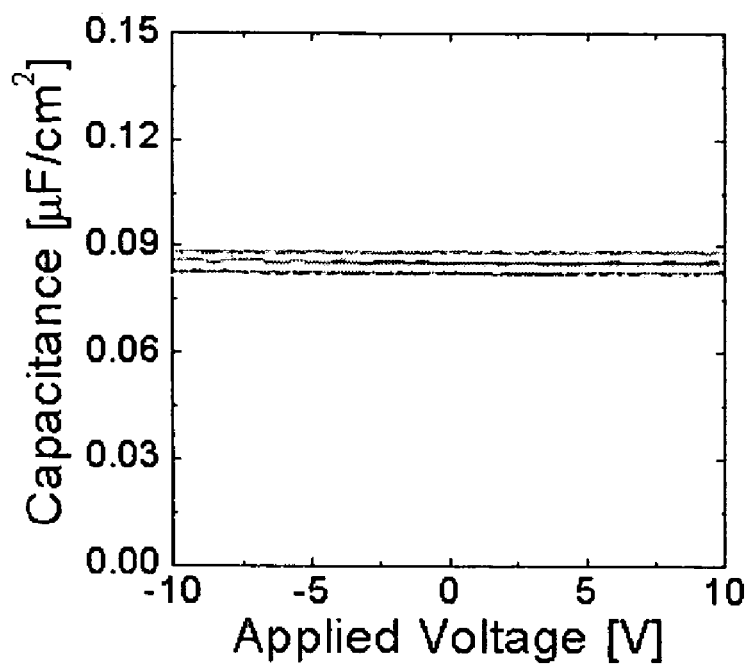
FIG. 5 is a graphic diagram showing capacitance as a function of applied voltage for an $Al_2O_3$ thin film deposited onto the copper foil of a copper-clad laminate according to the present invention.
Figure 6:
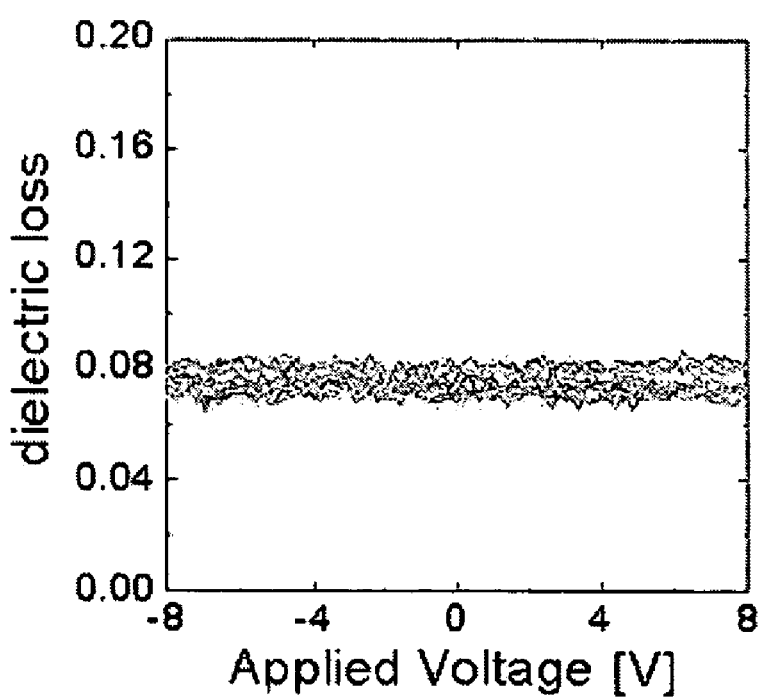
FIG. 6 is a graphic diagram showing dielectric loss coefficient as a function of applied voltage for an $Al_2O_3$ thin film deposited on the copper foil of a copper-clad laminate according to the present invention.
Figure 7:
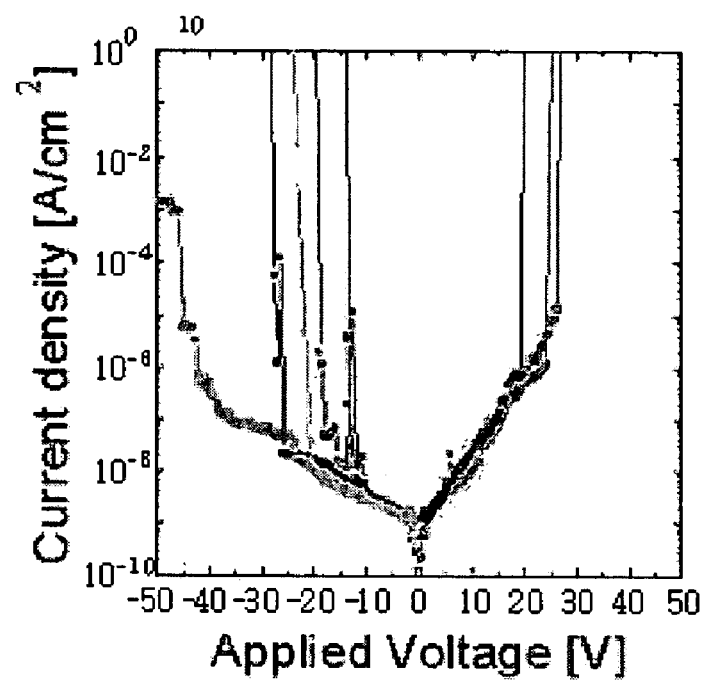
FIG. 7 is a graphic diagram showing leakage current as a function of applied voltage for an $Al_2O_3$ thin film deposited on the copper foil of a copper-clad laminate according to the present invention.

FIG. 5 is a graphic diagram showing capacitance versus applied voltage for the Al$_2$O$_3$ thin film deposited on the copper foil of the copper-clad laminate, FIG. 6 is a graphic diagram showing a dielectric loss coefficient versus applied voltage for the Al$_2$O$_3$ thin film deposited on the copper foil of the copper-clad laminate, and FIG. 7 is a graphic diagram showing leakage current versus applied voltage for the Al$_2$O$_3$ thin film deposited on the copper foil of the copper-clad laminate.

As can be seen in FIGS. 5 and 6, the capacitance of the Al$_2$O$_3$ thin film formed on the copper foil is maintained almost constant regardless of changes in applied voltage. Also, the dielectric loss coefficient of the film has a lower value than a film formed by sputtering or sol-gel (>0.1), and is maintained constant according to changes in applied voltage. The dielectric constant of the Al$_2$O$_3$ thin film is about 7, which is similar to the dielectric constant of bulk Al$_2$O$_3$. As shown in FIG. 7, the breakdown voltage of the film is about ±20-30V, indicating that the dielectric breakdown of the film occurs when a high electric field of about 4-5 MV/cm is applied. These properties indicate that, when a dielectric film is deposited on a copper-clad laminate by the atomic layer deposition, the dielectric film is successfully deposited without serious deformation of the Cu electrode or the deterioration of the Cu electrode interfacial layer. Also, the fact that the measured dielectric constant of the Al$_2$O$_3$ thin film is similar to the dielectric constant of bulk Al$_2$O$_3$ means that the thin film was uniformly formed on the rough Cu substrate.

The above test results indicate that the use of atomic layer deposition as a method of forming an alumina dielectric film on a Cu electrode has very great advantages, and that the atomic layer deposition is highly applicable in the manufacturing of a printed circuit board having embedded capacitors therein.

According to the present invention, prior to the step of forming this dielectric layer, an antioxidant layer made of at least one metal selected from Pt, Ir, Au, Ru, Ni, Al, W, Mo, Ta and Ti, or a conductive oxide or nitride thereof, may also be formed, in order to prevent the oxidation of the copper layer. The thickness of the antioxidant layer is typically 10-500 nm.

On the inventive dielectric layer formed as described above, top electrodes located opposite the bottom electrodes can be formed according to one method selected from, for example, the following five methods.

In the first method, in order to improve the adhesion and interfacial properties between the dielectric layer and a metal layer, a metal seed layer made of Ni, Cr, Mo or a combination thereof is formed on the dielectric layer by thin electroless plating (e.g., 100-5000 Å). Then, on the metal seed layer, a copper plating layer (e.g., 10-30 μm) is formed by electroplating to form a metal layer. Then, on the metal layer, a given photoresist dry film pattern is formed, and the metal layer is etched by exposure and development to form top electrodes and circuit patterns.

In the second method, on the dielectric layer, a conductive paste of Ru, Cu, Ni, Cr, Mo or a combination thereof is formed by screen printing or inkjet printing, and is then dried at a given temperature to form a metal layer (e.g., 10-50 μm). Next, the dried paste is patterned using a mask to form top electrodes and circuit patterns. This method is advantageous in that it reduces process time and cost compared to the first method, because it can be carried out without exposure, etching and development steps.

In the third method, on the dielectric layer, a metal seed layer (e.g., 100-5000 Å) made of Ru, Cu, Ni, Cr, Mo or a combination thereof is formed by sputtering or evaporation. On the metal seed layer, a copper plating layer (e.g., 10-30 μm) is formed by electroplating to enhance the adhesion between the dielectric layer and the metal layer. On the copper plating layer, a given photoresist dry film pattern is formed, and the copper plating layer is etched by exposure and development to form top electrodes and circuit patterns.

In the fourth method, on the dielectric layer, a metal layer (e.g., 100-5000 Å) of Ru, Cu, Ni, Cr, Mo or a combination thereof is formed by atomic layer deposition. On the metal layer, a given dry film pattern is formed, and the metal layer is etched by exposure or development to top electrodes and circuit patterns. Particularly, the use of this method has an advantage in that it is possible to further increase the capacitance value and junction strength of the alumina thin film with excellent step coverage, which is formed by atomic layer deposition in the previous step.

In the fifth method, on the dielectric layer, a metal oxide seed layer (e.g., 100-5000 Å) made of ITO or $RuO_2$ is formed by sputtering or evaporation. On the metal seed layer, a copper plating layer (e.g., 10-30 μm) is formed by electroplating. This prevents the penetration of a plating solution to increase the adhesion between the dielectric layer and the metal layer. Then, on the copper plating layer, a given dry film pattern is formed, and the metal layer is etched by exposure and development to form top electrodes and circuit patterns.

Hereinafter, a process for manufacturing the printed circuit board with embedded capacitors therein according to a preferred embodiment of the present invention will be described with reference to FIGS. 8A to 8I.

First, on the outer layers of a double-sided copper-clad laminate having dielectric resin 101 sandwiched between copper foils, photo resist dry films are deposited, followed by exposure and development. Predetermined portions "F" of the copper foils are etched to form first circuit layers including capacitor bottom electrodes 102a-102d and circuit patterns (see FIG. 8A).

Prior to the step of forming the first circuit layers, the outer layers of the copper-clad laminate may also be imparted with an additional roughness (Ra) of 1-5 μm to enlarge the surface area thereof, thus increasing the capacitance values. The formation of the roughness may be performed using any one selected from soft etching, black oxide, brown oxide, ABC (acid base chemical), ceramic buff, Z-scrubbing and a combination thereof.

Figure 8A:
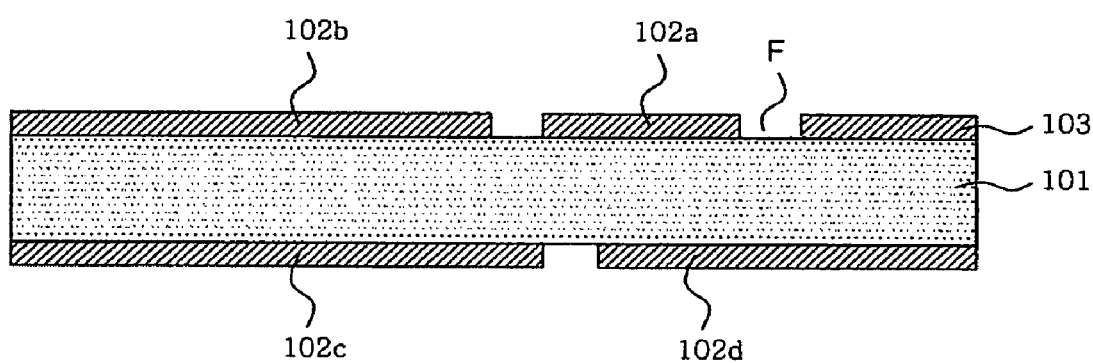
FIGS. 8A to 8I are cross-sectional views explaining a process for manufacturing a printed circuit board having embedded capacitors therein according to a preferred embodiment of the present invention.
Figure 8B:
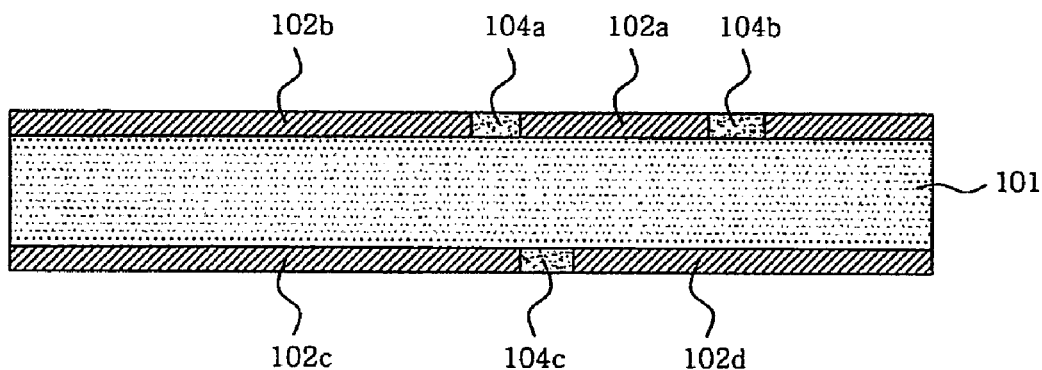

Then, in the etched portions "F", an insulating material 104a-104c is filled and planarized (see FIG. 8B). The filling and planarization of the insulating material 104a-104c may be performed by vacuum printing. For example, the etched portions "F" are filled using a mask made of silk by screening in a vacuum chamber, and planarized with ceramic buffer.

Figure 8C:
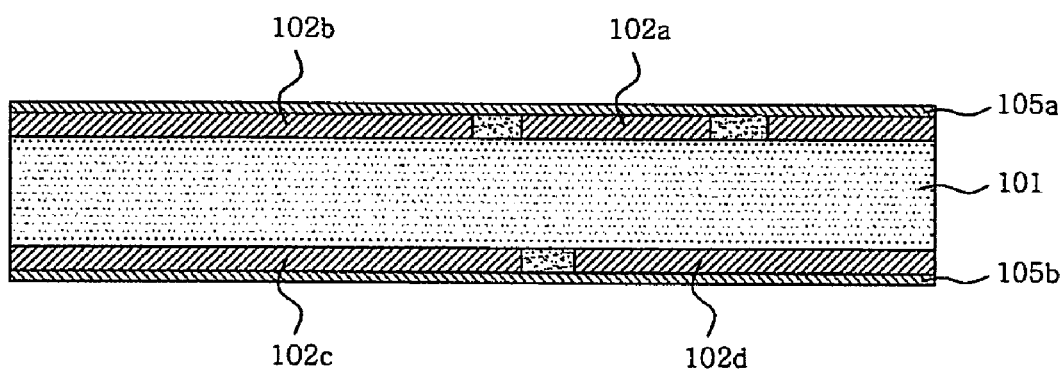

Then, on the first circuit layers, alumina films are deposited by atomic layer deposition, to form dielectric layers 105a and 105b (see FIG. 8C).

Prior to the step of forming the dielectric layers 105a and 105b on the first circuit layers, antioxidant layers made of at least one metal selected from the group consisting of Pt, Ir, Au, Ru, Ni, Al, W, Mo, Ta and Ti, or a conductive oxide or nitride thereof, may optionally be formed to prevent the oxidation of the copper layers 102a-102d and 103.

Meanwhile, the dielectric layers 105a and 105b are formed by depositing alumina films using trimethyl aluminum (TMA) as source gas by the atomic layer deposition at a board temperature of 25-250° C., preferably 100-200° C., and more preferably 120-150° C. If the board temperature is less than 25° C., the characteristic of the alumina films as dielectric materials will not be ensured. On the other hand, a board temperature of more than 250° C. will cause deformation of the resin board and will be disadvantageous in terms of efficiency and economy.

Also, the dielectric layers 105a and 105b are formed by repeatedly performing the atomic layer deposition using (i) a source gas of trimethylaluminum and (ii) a source gas of $H_2O$, $H_2O$ plasma, $O_2$ plasma or $O_3$ oxidant, which are sequentially introduced, so as to deposit the alumina films to the desired thickness. In this regard, after the introduction of each of the source gases, inert gas is introduced for purging.

The thickness of each of the dielectric layers 105a and 105b is 50-5000 Å, and preferably 100-750 Å, in view of the efficiency and economy, to achieve high dielectric capacitance values.

Predetermined portions of the alumina films 105a and 105b formed for use as the dielectric materials of the inventive capacitors may, if necessary, be removed by etching such that the films will be formed only on portions of the bottom electrodes 102a-102d.

The etching can be carried out by a wet or dry etching process. The wet etching process is carried out as in conventional printed circuit board processes by applying photoresist dry films on the alumina films in given patterns and exposing only the portions desired to be etched, by exposure and development processes, followed by etching the alumina films with alumina etchant. The drying etching process is carried out by etching the alumina films with ion beam or plasma. Particularly, the dry etching process is advantageous in that it can be carried out in vacuum pressure using mainly RIE equipment.

In the etched portions of the alumina films, the insulating material is filled and planarized as described above for the first circuit layers.

Figure 8D:
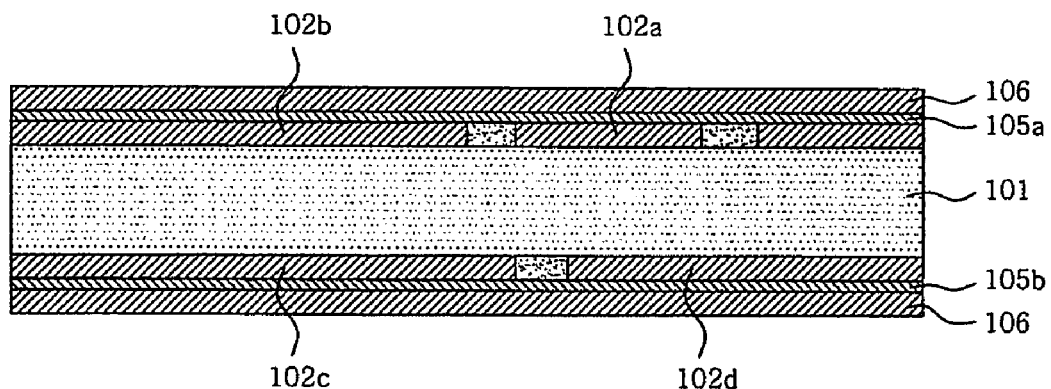
Figure 8E:
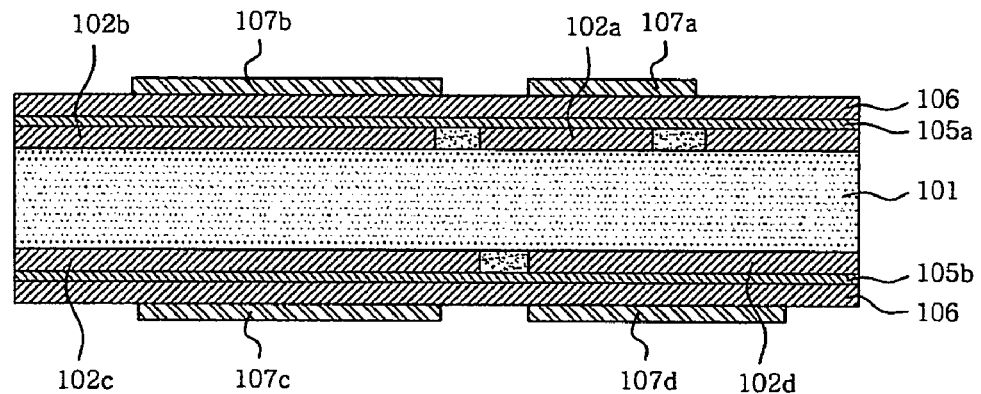
Figure 8F:
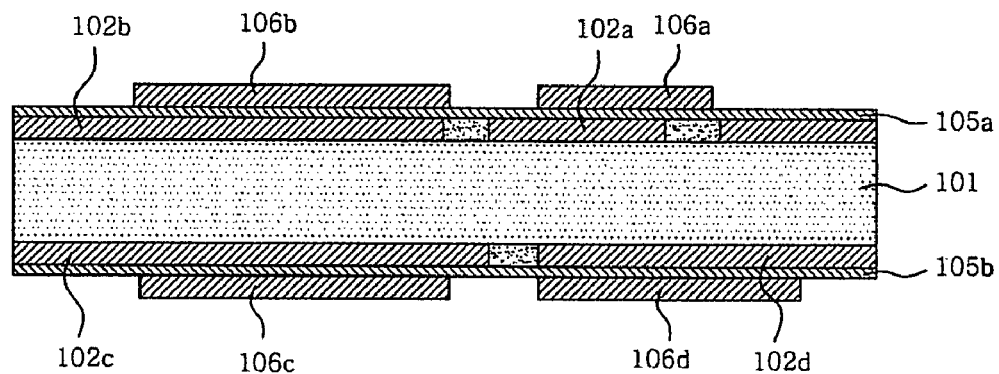

Then, on the dielectric layers 105a and 105b, metal layers 106 are formed (see FIG. 8D). On the metal layers 106, given photoresist dry film patterns 107a-107d are formed such that top electrodes will be formed opposite the bottom electrodes 102a and 102d while interposing the dielectric layers 105a and 105b therebetween (see FIG. 8E). Then, etching is performed by exposure and development to form second circuit layers including top electrodes 106a-106d opposite the bottom electrodes 102a-102d, and circuit patterns (not shown) (see FIG. 8F).

Although the method for forming the second circuit layers including the top electrodes 106a and 106d and circuit patterns is not specifically limited, it can be performed according to any one of the following five methods.

In the first method, in order to improve the adhesion and interfacial properties between each of the dielectric layers and metal layers, metal seed layers made of Ni, Cr, Mo or a combination thereof are formed on the dielectric layers by thin electroless plating. Then, on the metal seed layers, copper plating layers are formed by electroplating to form metal layers. Then, on the metal layers, given dry film patterns are formed, and the metal layers are etched by exposure and development to form top electrodes and circuit patterns.

In the second method, on each of the dielectric layers, a conductive paste containing a conductive nano-metal selected from Ru, Cu, Ni, Cr, Mo or a combination thereof is applied by screen printing or inkjet printing, and then dried at a given temperature to form metal layers. Next, the dried pastes are patterned using a mask to form top electrodes and circuit patterns.

In the third method, on the dielectric layers, metal seed layers made of Ru, Cu, Ni, Cr, Mo or a combination thereof are formed by sputtering or evaporation. On the metal seed layers, copper plating layers are formed by electroplating to enhance the adhesion between the dielectric layers and the metal layers. On the copper plating layers, given dry film patterns are formed, and the copper plating layers are etched by exposure and development to form top electrodes and circuit patterns.

In the fourth method, on the dielectric layers, metal layers made of Ru, Cu, Ni, Cr, Mo or a combination thereof are formed by atomic layer deposition. On the metal layers, given dry film patterns are formed, and the metal layers are etched by exposure or development to top electrodes and circuit patterns.

In the fifth method, on the dielectric layers, metal seed layers made of ITO or $RuO_2$ are formed by sputtering or evaporation. On the metal seed layers, copper plating layers are formed by electroplating. This prevents the penetration of a plating solution to increase the adhesion between the dielectric layer and the metal layer. Then, on the copper plating layer, given dry film patterns are formed, and the metal layers are etched by exposure and development to form top electrodes and circuit patterns.

Figure 8G:
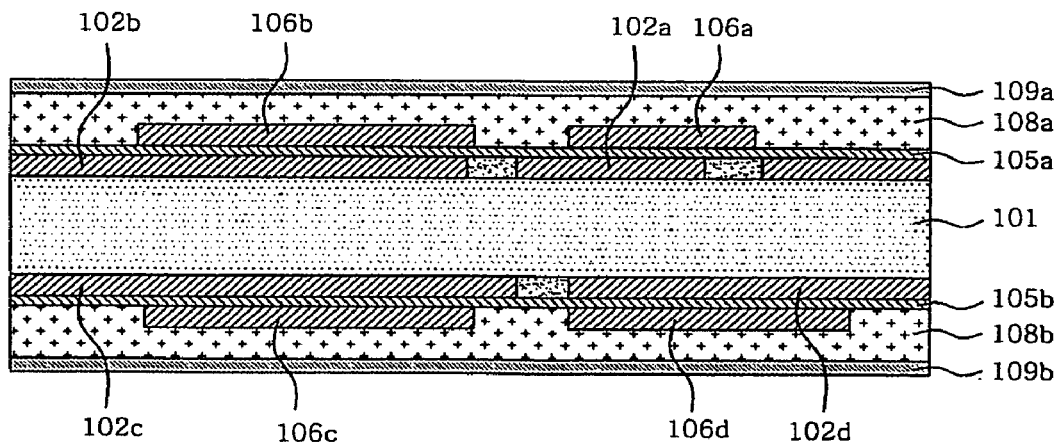
Figure 8H:
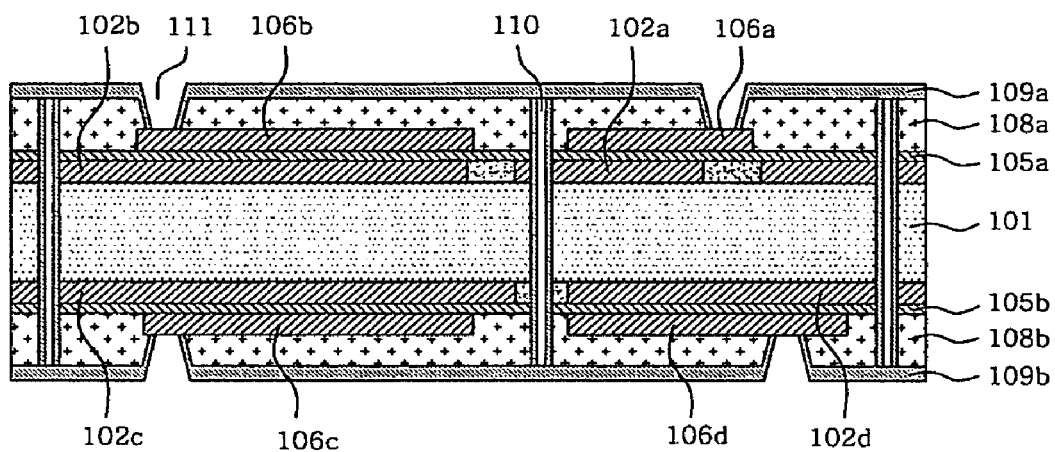
Figure 8I:
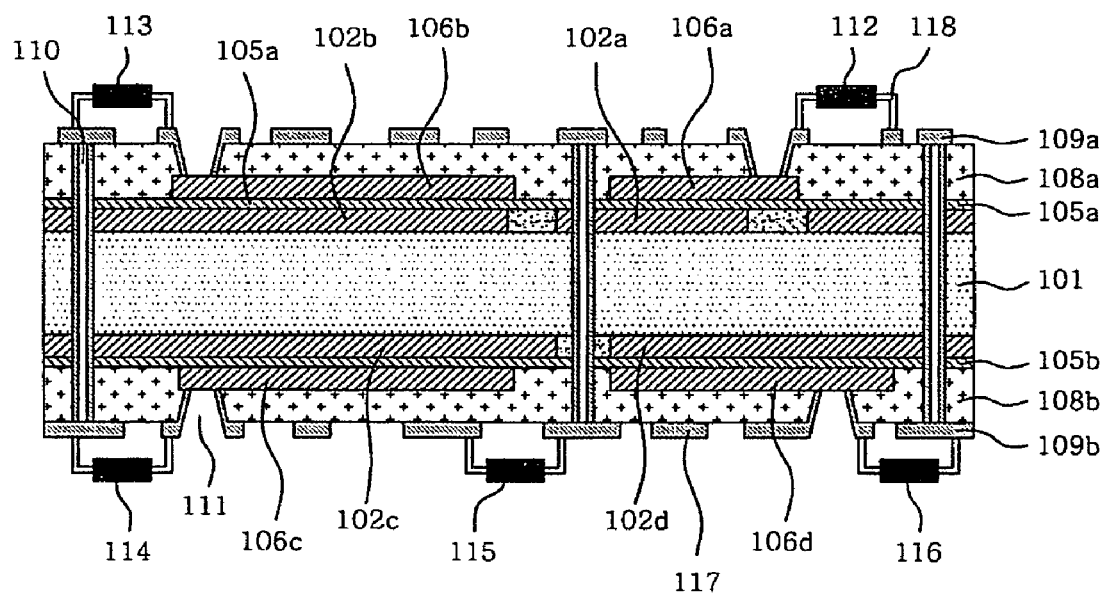

Thereafter, on the capacitors having the top electrodes 106a-106d formed thereon, one-sided copper-clad laminates, for example, resin-coated copper (RCC) foils 108a+109a and 108b+109b, are laminated by a building-up process (see FIG. 8G).

Next, the one-sided copper-clad laminates 108a+109a and 108b+109b are drilled with a laser drill to form blind via-holes 111, and are drilled with a mechanical drill to form through-holes 110. The blind via-holes 111 and the through-holes 110 are plated by an electroless plating process. In this regard, the via-holes 111 are connected to the respective top electrodes 106a-106d, and the through-holes 110 are connected to the respective bottom electrodes 102a-102d (see FIG. 8H).

Finally, signal circuit patterns 117 are formed on the one-sided copper-clad laminates 108a+109a and 108b+109b. Thereafter, IC chips 112 to 116 having different operating voltages are connected to power distributed decoupling capacitors (second, third and fourth capacitors) commonly connected to the ground electrodes 102a to 102d, and a signal matching capacitor (a first capacitor) singly connected to the ground electrodes, respectively, depending on the divided top electrodes 106a to 106d and bottom electrodes 102a to 102d. Thus, a multilayered printed circuit board with having the embedded signal matching capacitor and the power distributed decoupling capacitors therein is manufactured (see FIG. 8I). Reference numeral 118 designates wire bindings for connecting the IC chips 112 to 116 to the capacitors.

The dielectric layers of the capacitor-embedded printed circuit board manufactured as described above will act as signal matching capacitors and decoupling capacitors for IC chips.

As described above, according to the present invention, alumina, selected from ceramic dielectric materials having high dielectric constants, is used to form dielectric layers by the atomic layer deposition. Thus, the high dielectric properties of alumina can be ensured even at low process temperatures (25-250° C.), rather than the high process temperatures required for conventional ceramic materials. Accordingly, dielectric layers for embedded capacitors, which have not only a high capacitance of several tens to several thousands $nF/inch^2$ or more but also excellent step coverage properties, can be formed over large areas in a temperature range in which the substantial deformation of a substrate does not occur.

Also, owing to the surface roughness of printed circuit board copper foil layers, a large surface area can be ensured so that embedded capacitors having high capacitance values, in particular, high capacitance per unit substrate area, can be realized.

Furthermore, it is possible to form a dielectric layer having high capacitance values by forming a high-dielectric alumina film on a copper-clad laminate having bottom electrodes formed therein, by atomic layer deposition to a thickness of several tens to several thousands of Å, and then, forming top electrodes on the dielectric layer, followed by performing a build-up process for manufacturing a multi-layer printed circuit board.

As described above, according to the present invention, the embedded capacitors are formed by depositing a ceramic dielectric of alumina other than the composite material of sheet-type embedded capacitors according to the prior art, thereby ensuring high dielectric values. Also, it is possible to form the dielectric layer at low temperatures where the deformation of a printed circuit board made of resin does not occur. Also, the dielectric layer can be formed over a large area (405×510) by the use of a chemical reaction controlling an atomic monolayer.

Moreover, owing to the surface roughness of the printed circuit board copper foil layer, a large surface area can be ensured so that embedded capacitors having high capacitance values, in particular, high capacitance per unit of substrate area, can be realized.

Furthermore, simultaneous double-sided deposition, suitable for printed circuit board processes, is possible, resulting in reductions in lead time and cost and an increase in productivity. In addition, the alumina dielectric thin films formed by atomic layer deposition according to the present invention have good uniformity so that they can be applied not only as decoupling capacitors but also as signal matching capacitors where temperature characteristics (COG) are very important.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A process for manufacturing a printed circuit board having embedded capacitors therein, the process comprising steps of:

forming first circuit layers, including bottom electrodes and circuit patterns, in outer layers of a double-sided copper-clad laminate;

depositing alumina ($Al_2O_3$) films on the first circuit layers by atomic layer deposition (ALD) to form dielectric layers thereon;

forming second circuit layers including top electrodes and circuit patterns, on the dielectric layers;

depositing one-sided copper-clad laminates on the second circuit layers;

forming blind via-holes and through-holes in predetermined portions of the one-sided copper-clad laminates; and plating the blind via-holes and the through-holes to make connections between the layers, wherein the step of forming the dielectric layers further comprises the steps of:

etching predetermined portions of the deposited alumina films to remove the remaining portions of the alumina films except for portions on the bottom electrodes; and filling the etched portions with an insulating material and planarizing the filled material.

2. The process of claim 1, which further comprises, before the step of forming the first circuit layers, a step of imparting a roughness of 1-5 μm to the outer layers of the double-sided copper-clad laminate.

3. The process of claim 2, wherein the step of imparting the roughness is carried out by any one selected from soft etching, black oxide, brown oxide, ABC (acid base chemical), ceramic buff and Z-scrubbing, or combinations thereof.

4. The process of claim 1, wherein the step of forming the first circuit layer comprises steps of:

forming photoresist dry film patterns on each of the outer layers of the double-sided copper-clad laminate, and etching the outer layers in the form of the dry film patterns to form bottom electrodes and circuit patterns; and filling the etched regions with an insulating material and planarizing the filled material.

5. The process of claim 4, wherein the filling and planarization of the insulating material is performed by vacuum printing.

6. The process of claim 1, which further comprises, before the step of forming the dielectric layer, a step of forming antioxidant layer, made of at least one metal selected from the group consisting of Pt, Ir, Au, Ru, Ni, Al, W, Mo, Ta and Ti, or a conductive oxide or nitride thereof, on the first circuit layers.

7. The process of claim 1, wherein the step of forming the dielectric layer is carried out by depositing an alumina film using trimethyl aluminum (TMA) as a source gas by atomic layer deposition at a substrate temperature maintained within 25-250° C.

8. The process of claim 7, wherein the substrate temperature is maintained within 20 100-200° C.

9. The process of claim 8, wherein the substrate temperature is maintained within 120-150° C.

10. The process of claim 1, wherein the step of forming the dielectric layers is carried out by repeatedly performing the atomic layer deposition using a source gas of trimethylaluminum and a source gas of $H_2O$, $H_2O$ plasma, $O_2$ plasma or $O_3$ oxidant, which are sequentially introduced, so as to deposit the alumina films to the desired thickness, in which, after the introduction of each of the source gases, inert gas for purging is introduced.

11. The process of claim 1, wherein the etching is performed by:

forming photoresist dry film patterns on the alumina films, and then, etching the alumina films by exposure to light and by development, or etching the alumina films using ion beam or plasma.

12. The process of claim 1, wherein each of the dielectric layers is formed to a thickness of 50-5000 Å.

13. The process of claim 1, wherein the step of forming the second circuit layers comprises the steps of:

forming metal seed layers made of Ni, Cr, Mo or a combination thereof on the dielectric layers by electroless plating;

forming copper plating layers on the metal seed layers by electroplating; and forming photoresist dry films on the copper plating layers and etching the copper plating layers by exposure to light and by development to form top electrodes and circuit patterns.

14. The process of claim 1, wherein the step of forming the second circuit layers comprises the steps of:

applying a conductive paste made of Ru, Cu, Ni, Cr, Mo or a combination thereof to the dielectric layers by screen printing or inkjet printing;

drying the applied paste; and patterning the dried paste using a mask to form top electrodes and circuit patterns.

15. The process of claim 1, wherein the step of forming the second circuit layers comprises steps of:

forming metal seed layers made of Ru, Cu, Ni, Cr, Mo or a combination thereof on the dielectric layers by sputtering or evaporation;

forming copper plating layers on the metal seed layers by electroplating;

forming photoresist dry film patterns on the copper plating layers; and etching the copper plating layers by exposure to light and by development to form top electrodes and circuit patterns.

16. The process of claim 1, wherein the step of forming the second circuit layers comprises the steps of:

forming metal layers made of Ru, Cu, Ni, Cr, Mo or a combination thereof on the dielectric layers by atomic layer deposition;

forming photoresist dry film patterns on the metal layers; and etching the metal layers by exposure to light and by development to form top electrodes and circuit patterns.

17. The process of claim 1, wherein the step of forming the second circuit layers comprises the steps of:

forming metal oxide seed layers of ITO or $RuO_2$ on the dielectric layers by sputtering or evaporation;

forming copper plating layers on the metal oxide seed layers by electroplating;

forming photoresist dry film patterns on the copper plating layers; and etching the copper plating layers by exposure to light and by development to form top electrodes and circuit patterns.

18. The process of claim 1, wherein the one-sided copper-clad laminates are laminated by a building-up process.

* * * * *